United States Patent [19]
Ochi et al.

[11] 3,988,689
[45] Oct. 26, 1976

[54] OFFSET CORRECTED AMPLIFIER

[75] Inventors: Sam S. Ochi, Santa Clara; Adib R. Hamade, San Jose, both of Calif.

[73] Assignee: National Semiconductor Corporation, Santa Clara, Calif.

[22] Filed: Feb. 7, 1975

[21] Appl. No.: 548,082

[52] U.S. Cl. ............................. 330/9; 330/30 D; 330/35; 330/51; 330/85
[51] Int. Cl.² ........................................... H03F 1/26
[58] Field of Search ............... 330/9, 30 D, 51, 85, 330/35, 149, 69; 328/151

[56] References Cited
UNITED STATES PATENTS

| | | | |
|---|---|---|---|
| 2,946,013 | 7/1960 | Deighton | 328/151 |
| 3,667,055 | 5/1972 | Uchida | 330/9 X |

OTHER PUBLICATIONS

Hellwarth et al., "Automatic Zero–Correction Amplifier," *IBM Technical Disclosure Bulletin*, vol. 15, No. 1, pp. 140, 141, June 1972.
Hellwarth et al., "Differential Automatic Zero–Correction Amplifier," *IBM Technical Disclosure Bulletin*, vol. 15, No. 9, Feb. 1973, pp. 2719–2720.
Jaeger et al., "Dynamic Zero–Correction Method Suppresses Offset Error in Op Amps," *Electronics*, Dec. 4, 1972, pp. 109, 110.

*Primary Examiner*—James B. Mullins
*Attorney, Agent, or Firm*—Lowhurst & Aine

[57] ABSTRACT

A circuit for cancelling the offset voltage of a signal amplifier includes a second amplifier and a third amplifier connected to the outputs of the signal amplifier and the second amplifier. A capacitor is connected between the inputs of the second amplifier for storing the offset voltages of the amplifiers thereon. A switch connects the output of the third amplifier to the capacitor and a switch connects the inputs of the signal amplifier together during offset correction. When the offset voltages are stored on the capacitor, the switches open to permit signal amplification and cancellation of the offset voltages. In a second embodiment, a second capacitor stores the instantaneous amplitude of the signal being amplified and supplies it to an input of the second amplifier such that a discontinuity will not appear in the circuit output during offset correction.

6 Claims, 7 Drawing Figures

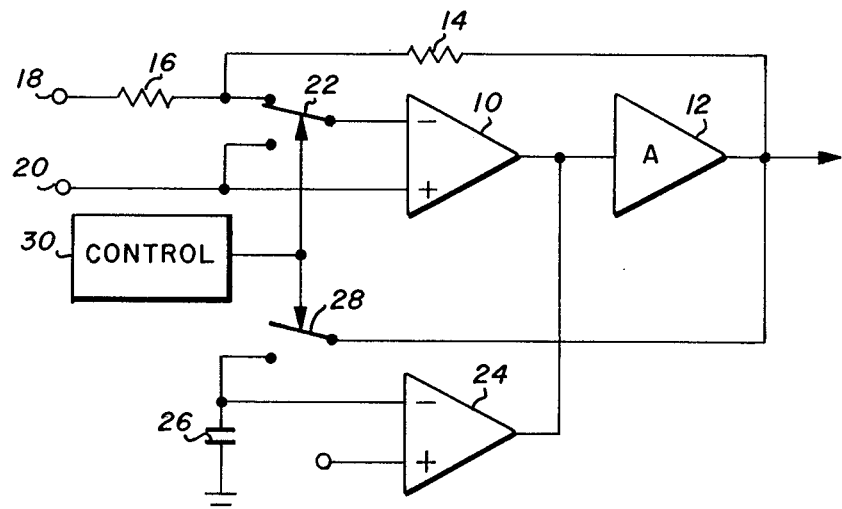
*Fig_1*
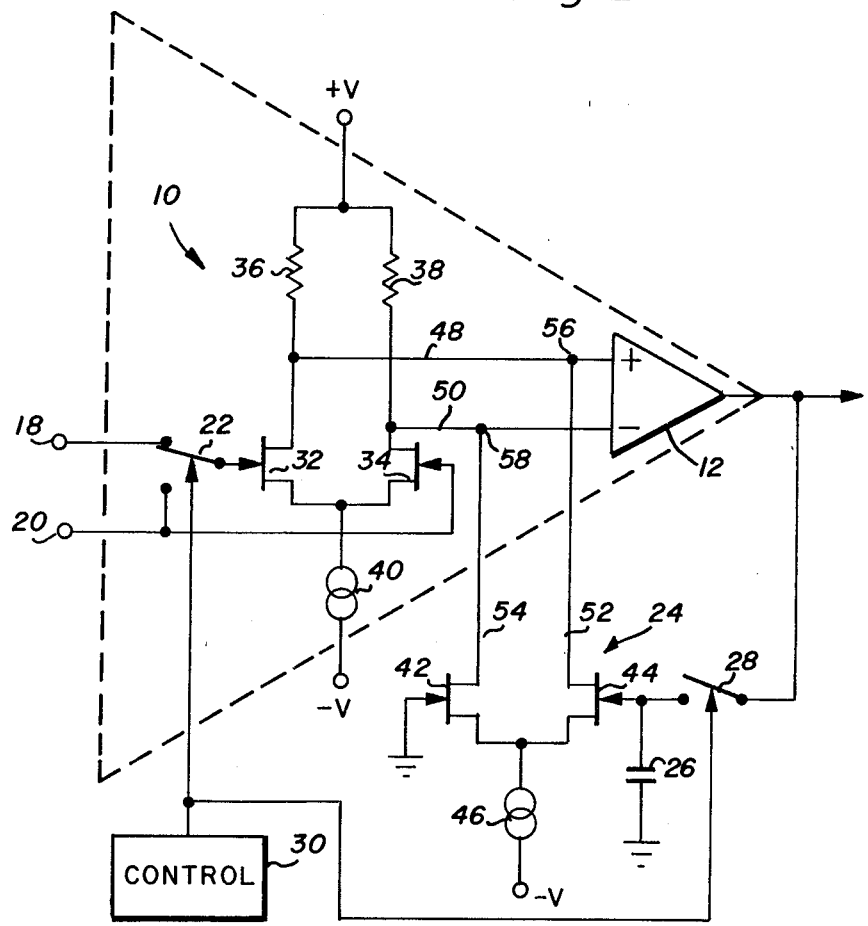
*Fig_2*

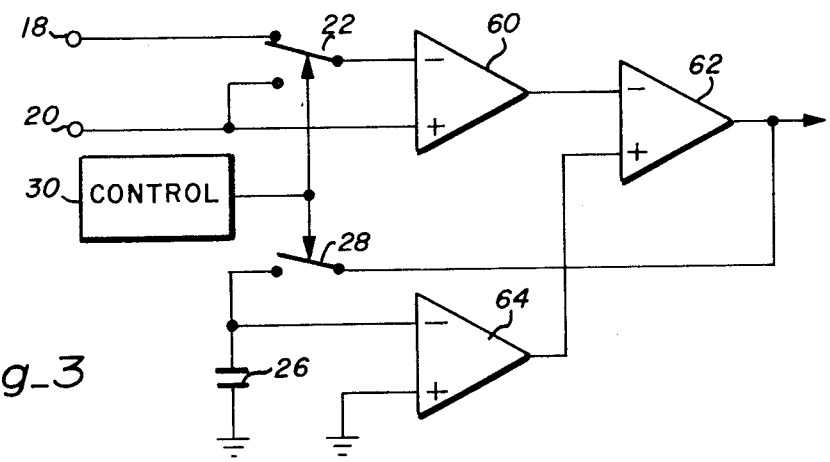
Fig_3
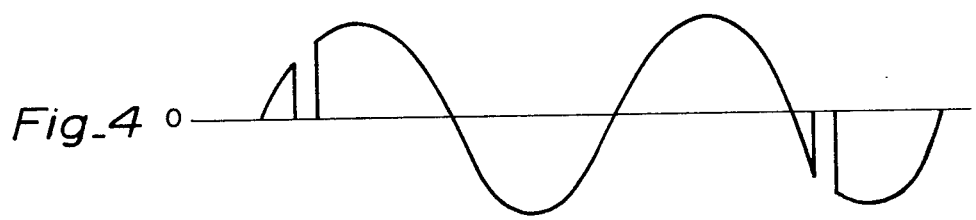
Fig_4
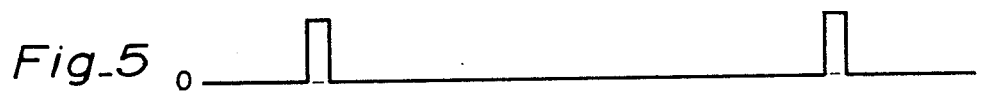
Fig_5
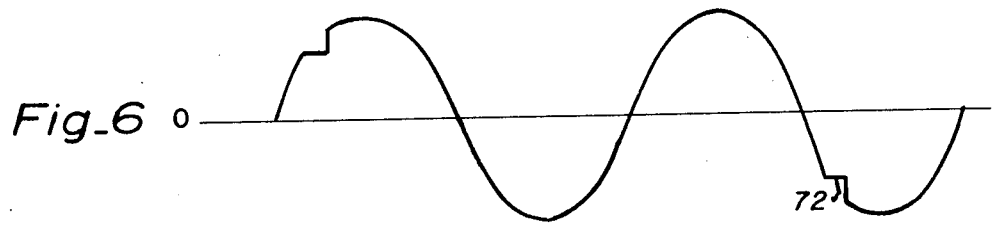
Fig_6
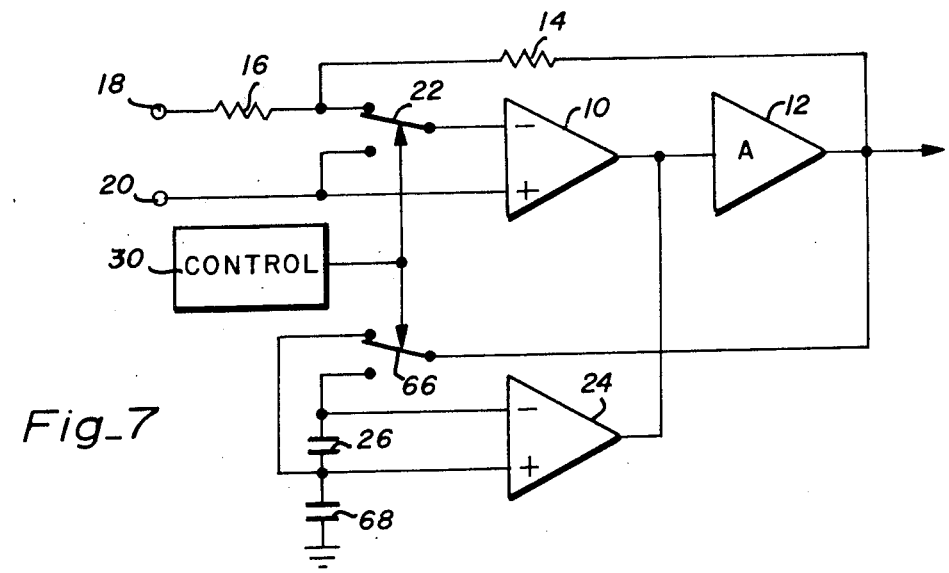
Fig_7

OFFSET CORRECTED AMPLIFIER

BACKGROUND OF THE INVENTION

1. Field of the Invention

This invention relates generally to amplifier circuits, and more particularly to an amplifier circuit having offset voltage correction.

2. Prior Art

The offset voltage of an amplifier is generally considered as noise and may be generated as the result of a number of factors such as, for example, mismatch of the active elements or of the load impedances of such an amplifier. The offset voltage of a particular amplifier can be defined as that voltage which is required at the inputs of an equivalent ideal amplifier to produce an output equal to the output of that particular amplifier when its inputs are connected together. That is, if the inputs of a differential amplifier, for example, are connected together, any generated output which is different from zero is equal to the offset voltage of that differential amplifier multiplied by its gain. Accordingly, it can be appreciated that the offset voltage of an amplifier will cause an error in its output signal.

One technique which has been employed in the past for correcting the offset voltage of a differential amplifier involves the use of a circuit for sensing and storing that offset voltage during a first time period and supplying it to the amplifier input in such a manner that it is in opposition to the offset voltage during a second time period when the amplifier is connected to the signal source. Generally, the implementation of this technique involves the disconnection of the inputs of the differential amplifier from the signal source and the subsequent connection of those inputs to one another. The product of the offset voltage and the gain of the amplifier will, therefore, appear at the output of the differential amplifier. By connecting the output of the differential amplifier through an inverter to a capacitor, for example, a voltage which is proportional, but of opposite polarity, to the offset voltage will be stored thereon. With the capacitor connected to the noninverting input of the differential amplifier a unity gain feedback is provided such that the stored voltage will be equal to the offset voltage. When the signal source is subsequently connected to the inverting input of the differential amplifier and the inverter disconnected from the storage capacitor, the offset voltage of the amplifier will be cancelled during signal amplification.

However, the connection of such a capacitor or any other storage element to the noninverting input of the differential amplifier precludes the use of that input for any other purpose. Accordingly, a differential amplifier employing the above described technique for offset correction thereof may not be employed in a number of well known circuit configurations, such as in a buffer amplifier configuration.

The above described offset correction technique requires the periodic disconnection of the signal source from the input of the differential amplifier and the periodic connection of the storage capacitor to its inverted output, such that the stored offset voltage is periodically replenished. Such disconnection of the signal source and replenishment of the storage capacitor causes a disruption in the output signal of the amplifier. That is, the output signal will be chopped whenever the offset voltage stored on the capacitor is being replenished. Such circuits, because of their chopped outputs, are called chopper stabilized amplifiers. Because of the discontinuities in the output signal, a filter must be employed at the output of the amplifier. However, the use of such a filter degrades the output signal and contributes to the cost of the amplifier circuit.

Furthermore, the above described offset correction circuit requires an inverter amplifier in a feedback loop which must have a relatively high frequency response. An inverter having a frequency response which will be sufficient to maintain stable operating conditions of the system will be at least as complex as the amplifier which is being offset corrected and would, therefore, be at least as expensive as such an amplifier. Accordingly, it can be appreciated that such offset correction increases the cost of the amplifier system considerably and degrades its output signal.

It can be appreciated, therefore, that a need exists for an amplifier circuit having offset correction in which both the inverting and the noninverting inputs thereof are available for connection of a signal source thereto. A need also exists for such an offset corrected amplifier which does not require an inverter, particularly one having a relatively high frequency response. Furthermore, such an offset corrected amplifier is needed which will produce an output signal which is not chopped during the offset correction mode thereof.

SUMMARY OF THE INVENTION

Accordingly, it is a primary object of the present invention to provide an offset corrected amplifier circuit.

Another object of the present invention is to provide such an offset corrected amplifier circuit in which both its inverting and its noninverting inputs are available for connection to a signal source.

Still another object of the present invention is to provide such an offset corrected amplifier circuit which does not require a relatively complex and expensive inverter amplifier in combination therewith.

A further object of the present invention is to provide such an offset corrected amplifier circuit which produces an output signal which is not discontinuous or chopped during the offset correction mode thereof.

These and other objects of the present invention are attained by a circuit for cancelling the offset voltage of a signal amplifier, which circuit includes a second amplifier and a third amplifier connected to the outputs of the signal amplifier and the second amplifier. The circuit also includes means for storing an output of the third amplifier during a first time period which is connected to an input of the second amplifier, such that when the inputs of the signal amplifier are connected together during the first time period, a voltage corresponding to the offset voltages of the signal amplifier and the second amplifier are stored thereon. When the inputs of the signal amplifier are disconnected from one another during a second time period immediately following the first time period, the offset voltage thereof is cancelled.

A feature of the present invention resides in the provision of a second storage element for storing the instantaneous value of the amplified signal and supplying it to the input of the second amplifier during the offset correction mode thereof, such that a discontinuity will not appear in the output signal during the offset correction mode.

The present invention provides the distinct advantage of having both the noninverting and the inverting inputs of the signal amplifier available for connection to any signal source or to any reference potential. Furthermore, the circuit of the present invention does not require the use of an inverter. Also, one embodiment of the present invention eliminates discontinuities in the amplified output signal during the offset correction mode thereof.

The invention, however, as well as other objects, features and advantages thereof will be more fully realized and understood from the following detailed description, when taken in conjunction with the accompanying drawings, wherein:

BRIEF DESCRIPTION OF THE DRAWINGS

FIG. 1 is a partial block and partial schematic diagram of an offset corrected amplifier circuit constructed in accordance with the principles of the present invention.

FIG. 2 is a partial block and partial schematic diagram of the circuit illustrated in FIG. 1.

FIG. 3 is a partial block and partial schematic diagram of another embodiment of the present invention using conventional operational amplifiers.

FIGS. 4 and 5 are graphical representations of waveforms which are useful in understanding the operation of the circuits illustrated in FIGS. 1-3.

FIG. 6 is a graphical representation of an idealized waveform useful in understanding the circuit illustrated in FIG. 7.

FIG. 7 is a partial block and partial schematic diagram of still another embodiment of an offset corrected amplifier of the present invention.

Like reference numerals throughout the various views of the drawings are intended to designate the same elements.

DETAILED DESCRIPTION OF THE PREFERRED EMBODIMENTS

With reference to FIG. 1 in detail, there is shown a transconductance amplifier 10 which produces an output current which is proportional to the voltage supplied at its inputs. An amplifier 12 is connected in series with the amplifier 10 and provides a voltage at its output which is proportional to a current supplied to its input. The amplifiers 10 and 12 connected as shown in FIG. 1 form an operational amplifier. Accordingly, the amplifiers 10 and 12 can be employed in the same manner as any operational amplifier and are shown in FIG. 1 with a feedback resister 14 and an input impedance in the form of a resister 16. Terminals 18 and 20 are disposed for connection to a signal source and are connected to respective inputs of the amplifier 10. More particularly, the terminal 18 is connected through the resister 16 and a switch 22 to the inverting input of the amplifier 10 and the terminal 20 is connected to the noninverting input thereof.

A second transconductance amplifier 24 has its output connected in parallel with the amplifier 10, such that its output current is summed with the output current of the amplifier 10 and supplied to the amplifier 12. The noninverting input of the amplifier 24 may be connected to any source or potential, such as ground potential, and the inverting input thereof is connected through a capacitor 26 to ground potential. Also, the output of the amplifier 12, which forms the output of the operational amplifier, is connected through a switch 28 to the inverting input of the amplifier 24. The switches 22 and 28 are ganged together and are controlled by a control circuit 30. It is to be understood that the switches 22 and 28 may be formed of analog gates.

When the switches 22 and 28 are in their illustrated positions, a signal supplied between the terminals 18 and 20 is amplified by the amplifiers 10 and 12. However, if the amplifiers 10 and 12 have an offset voltage, the output of the amplifier 12 will contain an error which is directly proportional to the value of the offset voltages of the amplifiers 10 and 12. Since the offset voltage of the amplifier 12 is reflected back to the input of the amplifier 10, its offset voltage will be effectively reduced by a factor equal to the gain of the amplifier 10. However, the offset voltage of the amplifier 10 is added directly to the signal supplied to the terminals 18 and 20 and is amplified by both of the amplifiers 10 and 12, thereby causing a significant error at the output of the amplifier 12.

The effect of the offset voltage of an amplifier can be better understood if such an amplifier is considered as an equivalent ideal amplifier having a voltage source in series with one of its inputs, which voltage source has a value equal to the offset voltage of that amplifier. Accordingly, that offset voltage will be added to the amplitude of the signal supplied to the terminals 18 and 20 and will be amplified therewith.

Since the output of the amplifier 24 is summed with the output of the amplifier 10, the offset voltage of the amplifier 24 will also be amplified and summed with the output of the amplifier 10 at the input of the amplifier 12. When the switches 22 and 28 are actuated from their illustrated positions, the inputs of the amplifier 10 are connected together and the output of the amplifier 12 is connected to the inverting input of the amplifier 24 and to the capacitor 26. With the inputs of the amplifier 10 connected together, a current will be provided at its output which will be equal to the amplitude of its offset voltage multiplied by its transconductance. If the offset voltage of the amplifier 10 is designated $V_1$ and its gain is designated $A_1$, the output of the amplifier 10 will be equal to $A_1V_1$ when its inputs are connected together by the switch 22. If the offset voltage of the amplifier 24 is designated $V_2$ and its gain is designated $A_2$, its output will be equal to $A_2V_2$ when the switch 28 is not closed. However, when the switch 28 is closed, the output of the amplifier 12 which will be designated $V_0$ is supplied to and stored on the capacitor 26. Accordingly, with the switch 28 closed, the noninverting input of the amplifier 24 connected to ground, its output will be equal to $A_2(V_2-V_0)$. Therefore, $$V_0 = A_3(A_1V_1 + A_2V_2 - A_2V_0) \tag{1}$$

where $A_3$ is the gain of the amplifier 12. From expression (1), $$V_0 = \frac{A_1A_3V_1 + A_2A_3V_2}{1 + A_2A_3}. \tag{2}$$

Since $A_2A_3$ is much greater than 1, it will be assumed that $1+A_2A_3$ is equal to $A_2A_3$. Then, $$V_0 = V_2 + \frac{A_1}{A_2}V_1. \tag{3}$$

If $A_1$ is equal to $A_2$, then $$V_0 = V_2 + V_1. \tag{4}$$

Accordingly, it can be appreciated that the voltage stored on the capacitor 26 when the switches 22 and 28 are actuated from their illustrated positions is equal to the summation of the offset voltages of the amplifiers 10 and 24. As mentioned above, the output of the amplifier 24 is equal to $A_2V_2-A_2V_0$. Therefore, from expression (3), the output of the amplifier 24 is equal to $A_2V_2-A_2V_2-A_1V_1$, or $-A_1V_1$. Accordingly, the output of the amplifier 24 during the offset correction mode when the switches 22 and 28 are actuated from their illustrated positions is equal and opposite to the output of the amplifier 10. It can be appreciated that the above analysis is valid only for ideal amplifiers in which the gain of the amplifier 12 is infinite. However, since the gain of the amplifier 12 is finite, a certain amount of drive current is required at its input in order to produce an output therefrom during the offset correction mode which will be equal to the summation of the offset voltages of the amplifiers 10 and 24. Accordingly, the offset voltage of the amplifiers 10 and 24 are corrected by a factor which is equal to the inverse of the open loop voltage gain of the amplifiers 10 and 12.

If the switches 22 and 28 are periodically actuated from their illustrated positions to replenish the charge on the capacitor 26, the offset voltages of the amplifiers 10 and 24 will be cancelled when the switches 22 and 28 are in their illustrated positions and a signal source is connected to the terminals 18 and 20. That is, when a signal source is connected to the terminals 18 and 20, that component of the output of the amplifier 10 which is contributed by the offset voltage of the amplifier 10 will be cancelled by a current supplied at the output of the amplifier 24. Accordingly, during signal amplification, the input to the amplifier 12 will be theoretically equal to the amplitude of the signal supplied to the terminals 18 and 20 multiplied by the gain of the amplifier 10.

FIG. 2 illustrates a circuit implementation of the amplifiers 10 and 24 for a better understanding of the circuit illustrated in FIG. 1. As shown therein, the amplifier 10 includes a pair of JFET's 32 and 34 connected as a differential pair, with load resisters 36 and 38 connecting their drains to a source of positive potential and a current source 40 connecting their sources to a source of negative potential. The amplifier 24 also includes a pair of JFET's 42 and 44 connected as a differential pair with the resisters 36 and 38 forming load resisters therefore and having a current source 46 connecting their sources to the source of negative potential. When the switch 22 is actuated from its illustrated position, differential drain currents will be produced in output lines 48 and 50 and supplied to the noninverting and inverting inputs, respectively, of the amplifier 12. From the above analysis, when the switch 28 is closed, a voltage is stored on the capacitor 26 which is equal to the offset voltages of the amplifiers 10 and 24. However, that portion of the voltage which is stored on the capacitor 26 which corresponds to the offset voltage of the amplifier 24 will be equal and opposite to the offset voltage of the amplifier 24 when it is supplied to the gate of the FET 44. Accordingly, differential drain currents will be developed at the output of the amplifier 24 on output lines 52 and 54 which will be equal and opposite to the differential drain currents on the lines 48 and 50. Accordingly, the differential drain currents generated by the amplifiers 10 and 24 as a result of the offset voltages of those amplifiers will cancel one another at current summation junctions 56 and 58 which are connected to the noninverting and inverting inputs, respectively, of the amplifier 12. Accordingly, when the switches 22 and 28 are in their illustrated positions and a signal source is connected to the terminals 18 and 20, the differential drain currents at the outputs of the amplifier 10 on the lines 48 and 50 will contain a component corresponding to the offset voltage of the amplifier 10. However, that component will be cancelled at the summing junctions 56 and 58 due to the differential drain currents generated on the output lines 52 and 54 due to the voltage developed on the capacitor 26 and the offset voltage of the amplifier 24.

Although the circuit implementation illustrated in FIG. 2 employs JFET's, such offset correction can also be performed using bipolar or MOS input stages for the amplifiers 10 and 24 and the load resisters 36 and 38 can be replaced with other well known types of loads, such as current source loads and cascoded loads, for example. The capacitor 26 forms a storage element for storing the offset voltages of the amplifiers 10 and 24. Accordingly, any type of storage element or device may be employed in place of the capacitor 26. If, for example, the amplifier 24 is a current to voltage amplifier, an inductor may be employed for storing a current in the form of a magnetic field which is proportional to the offset voltages of the amplifiers 10 and 24.

The principles of the present invention can also be practiced with operational amplifiers as shown in FIG. 3. If the amplifiers 10, 12 and 24 are replaced with operational amplifiers 60, 62 and 64, respectively, and connected as shown in FIG. 3, the offset voltages of those amplifiers will be cancelled at an output of that circuit.

If the offset voltages of the amplifiers 60, 62 and 64 are designated as $V_1$, $V_2$ and $V_3$, respectively, and their gains are designated $A_1$, $A_2$ and $A_3$, respectively, the following conditions will exist. When the switches 22 and 28 are actuated from their illustrated positions, the output of the amplifier 60 will be $A_1V_1$. If output of the amplifier 62 is designated $V_0$, the output of the amplifier 64 will be $A_3(V_3-V_0)$. Therefore, $$V_0 = A_2(V_2 - A_1V_1 + A_3V_3 - A_3V_0) \qquad (5)$$

from which, $$V_0 = \frac{A_2V_2 - A_1A_2V_1 + A_2A_3V_3}{1 + A_2A_3}. \qquad (6)$$

Since $A_2A_3$ is much greater that 1, it will be assumed that $1 + A_2A_3$ is equal $A_2A_3$. Then, $$V_0 = \frac{1}{A_3}V_2 - \frac{A_1}{A_3}V_1 + V_3. \qquad (7)$$

If $A_1$ is equal to $A_2$ and $V_1$ and $V_3$ are much greater than $V_2/A_3$, then $$V_0 = V_3 - V_1. \qquad (8)$$

Accordingly, it can be appreciated that the voltage stored on the capacitor 26 when the switches 22 and 28 are actuated from their illustrated positions is equal to the summation of the offset voltages of the amplifiers 60 and 64. As mentioned above, the output of the amplifier 64 is equal to $A_3V_3 - A_3V_0$. Therefore, from expression (7), the output of the amplifier 64 is equal to $A_1V_1 - V_2$. Accordingly, during the offset correction mode when the switches 22 and 28 are actuated from their illustrated positions, the summation of the output of the amplifier 60, the output of the amplifier 64 and the offset voltage of the amplifier 62 will be equal to zero. Again, it is to be understood that the above analyses is theoretical and based on ideal amplifiers.

If the circuits illustrated in FIGS. 1, 2 and 3 are employed for amplifying signals which are not continuous, the offset voltages stored on the capacitor 26 can be replenished during the quiescent state of the circuit. However, if a continuous signal is being supplied to the terminals 18 and 20, the output of the amplifiers 12 and 62 must be disrupted to permit the charge on the capacitor 26 corresponding to the offset voltages to be replenished. An example of an output signal having such disruptions is graphically illustrated in FIG. 4 if the control circuit 30 has a control function such as that illustrated graphically in FIG. 5. As mentioned above, the known prior art offset corrected amplifiers, which are called chopper stabilized amplifiers, also have the same disadvantage. It can be appreciated that such a disruption in the output signal is not desirable and requires the use of a filter to eliminate the chopped effect in the output signal. Of course, such a filter degrades the output signal. The circuit illustrated in FIG. 7, however, overcomes this problem.

The circuit of FIG. 7 differs from that of FIG. 1 only in the input circuit to the amplifier 24. As shown therein, a switch 66 is ganged with the switch 22 and connects the output of the amplifier 12 to the inverting input of the amplifier 24 when the circuit is in the signal amplification mode and connects the output of the amplifier 12 to the noninverting input of the amplifier 24 when the circuit is in the offset correction mode. The capacitor 26 is connected across the inputs of the amplifier 24. In addition a capacitor 68 is connected from the noninverting input of the amplifier 24 to ground potential.

If the designations employed in the discussion of FIG. 1 for the offset voltages and amplifier gains are employed for referring to the same offset voltages and amplifier gains of the circuit illustrated in FIG. 7 and if the output of the amplifier 12 during the offset correction is designated $V_{01}$ and the output of the amplifier 12 during signal amplification is designated $V_{02}$, then the following conditions exist. During the offset correction mode, the output of the amplifier 10 will be equal to $A_1V_1$. Also, the charge developed on the capacitor 68 will be $V_{02}$ and the charge developed on the capacitor 26 will be $V_{01} - V_{02}$. Accordingly, during offset correction, the output of the amplifier 24 will be $A_2 (V_2 - V_{01} + V_{02})$. Therefore, $$V_{01} = A_3(A_1V_1 + A_2V_2 - A_2V_{01} + A_2V_{02}) \quad (9)$$

Then, $$V_{01} = \frac{A_1A_3V_1 + A_2A_3V_2 + A_2A_3V_{02}}{1 + A_2A_3}. \quad (10)$$

Since $A_2A_3$ is much greater than 1, then, $$V_{01} = \frac{A_1}{A_2}V_1 + V_2 + V_{02}. \quad (11)$$

If $A_1$ is equal to $A_2$, then the charge developed on the capacitor 26 from expression (11) is equal to $V_1 + V_2$. Since the output of the amplifier 24, as mentioned above, is equal to $A_2 (V_2 - V_{01} + V_{02})$, substituting from expression (11), the output of the amplifier 24 will be equal to $-A_1V_1$. Therefore, during the signal amplification mode of the circuit illustrated in FIG. 7, and since the offsets of the amplifiers 10 and 24 cancel at the input of the amplifier 12, the output $V_{02}$ is equal to the amplitude of the signal supplied to the terminals 18 and 20 multiplied by the gain of the amplifiers 10 and 12. Accordingly, during offset correction, the output of the amplifier 12 is equal to the summation of the offset voltages and the amplified input signal.

It can be appreciated, therefore, that the instantaneous output of the amplifier 12 during signal amplification is stored on the capacitor 68. During offset correction, that stored potential contains the output of the amplifier 12 at the same amplitude during offset correction, as illustrated by the portions of the waveform of FIG. 6 which are designated with the reference numerals 70 and 72. Accordingly, the discontinuities which appear in the output signals of the circuits illustrated in FIGS. 1, 2 and 3 will not appear in the output signal of the circuit illustrated in FIG. 7.

The invention claimed is:

1. A circuit for cancelling the offset voltage of a signal amplifier which amplifier includes a first pair of active elements connected as a differential pair, comprising
   a. a second amplifier,
   b. a third amplifier connected to the output of said signal amplifier and to the output of said second amplifier,
   c. said second amplifier including a second pair of active elements connected as a differential pair, a first one of said first pair being connected in parallel with a first one of said second pair and to one input of said third amplifier, and a second one of said first pair being connected in parallel with a second one of said second pair and to another input of said third amplifier,
   d. first means connected to one input of said second amplifier for storing the output of said third amplifier,
   e. control means for connecting the inputs of said signal amplifier together and for connecting the output of said third amplifier to said first storage means during a first time period for disconnecting the inputs of said signal amplifier from one another and for disconnecting the output of said third amplifier from said first storage means during a second time period, and
   means connected to another input of said second amplifier for storing during said first and second time periods the output of said third amplifier which is generated during a third time period which precedes said first time period, and wherein said control means is disposed for disconnecting the inputs of said signal amplifier from one another during said third time period.

2. The circuit of claim 1, wherein said first storing means includes a first storage element and said second storing means includes a second storage element connected in series with said first storage element.

3. The circuit of claim 2, wherein said storage elements are capacitors.

4. A circuit for cancelling the offset voltage of a signal amplifier, comprising:
   a. a second amplifier,
   b. a third amplifier connected to the output of said signal amplifier and to the output of said second amplifier,
   c. storage means connected to one input of said second amplifier for storing the output of said third amplifier,
   d. control means for connecting the inputs of said signal amplifier together and for connecting the output of said third amplifier to said storage means during a first time period and for disconnecting the inputs of said signal amplifier from one another and for disconnecting the output of said third amplifier from said storage means during a second time period, and second storage means connected to another input of said second amplifier for storing during said first and second time periods the output of said third amplifier which is generated during a third time period which precedes said first time period, and wherein said control means is disposed for disconnecting the inputs of said signal amplifier from one another during said third time period.

5. The circuit of claim 4, wherein said first storing means includes a first storage element and said second storing means includes a second storage element connected in series with said first storage element.

6. The circuit of claim 5, wherein said storage elements are capacitors.

* * * * *